United States Patent [19]

Izunome et al.

[11] Patent Number: 5,704,974
[45] Date of Patent: Jan. 6, 1998

[54] GROWTH OF SILICON CRYSTAL FROM MELT HAVING EXTRAORDINARY EDDY FLOWS ON ITS SURFACE

[75] Inventors: Koji Izunome, Ami-machi; Souroku Kawanishi, Tsukuba; Shinji Togawa, Tsukuba; Atsushi Ikari, Tsukuba; Hitoshi Sasaki, Omiya; Shigeyuki Kimura, Tsukuba, all of Japan

[73] Assignees: Research Development Corporation of Japan, Saitama-ken; Sumitomo Sitix Corporation, Hyogo-ken; Toshiba Ceramics Co., Ltd.; Nippon Steel Corporation, both of Tokyo; Komatsu Electronic Metals Co., Ltd., Kanagawa-ken; Mitsubishi Materials Corporation, Tokyo, all of Japan

[21] Appl. No.: 620,873

[22] Filed: Mar. 22, 1996

[30] Foreign Application Priority Data

Mar. 24, 1995 [JP] Japan .................................. 7-091435

[51] Int. Cl.⁶ .................................................. C30B 15/22
[52] U.S. Cl. ............................... 117/28; 117/19; 117/30
[58] Field of Search .................................. 117/13, 14, 19, 117/28, 30, 200, 201

[56] References Cited

U.S. PATENT DOCUMENTS 4,618,396 10/1986 Shimoda et al. .......................... 117/17
5,306,387 4/1994 Fusegawa et al. ........................ 117/13

FOREIGN PATENT DOCUMENTS 5070279 10/1993 Japan .

*Primary Examiner*—Felisa Garrett
*Attorney, Agent, or Firm*—Webb Ziesenheim Bruening Logsdon Orkin & Hanson, P.C.

[57] ABSTRACT

When a Si single crystal 8 is pulled up from a melt 6 received in a crucible 2, the state of eddy flows generated in the melt 6 is judged from the temperature distribution of the melt at the surface. According to the result of judgement, the gas, i.e. $N_2$, Xe or Kr, which causes extraoridnary deviation in the density of a melt 6 is added to an atmospheric gas, so as to keep the eddy flows under unstabilized condition. The effect of said gas is typical in the case of crystal growth from the melt to which a dopant such as Ca, Sb, Al, As or In having the effect to suppress the extraordinary deviation in the density is added. Since the single crystal is pulled up from the melt held in the temperature-controlled condition at the surface, impurity distribution and oxygen distribution are made uniform along the direction of crystal growth. A single crystal obtained in this way has highly-stabilized quality.

4 Claims, 4 Drawing Sheets

(PRIOR ART)

STATE OF EDDY CURRENT
WITHOUT EXTRAORDINARY DENSITY

STATE OF EDDY CURRENTS
WITH EXTRAORDINARY DENSITY

GROWTH OF SILICON CRYSTAL FROM MELT HAVING EXTRAORDINARY EDDY FLOWS ON ITS SURFACE

BACKGROUND OF THE INVENTION

The present invention relates to a method of growing a Si single crystal of highly-stabilized quality useful as semiconductor material.

The method is a representative method for the growth of a Si single crystal from a melt.

The method uses a crucible 2 provided in a closed chamber 1 as shown in FIG. 1. The crucible 2 is supported by a support 3 so that the crucible 2 is capable of rotation and/or vertical motion. A heater 4 and a heat insulator 5 are concentrically disposed around the crucible 2, so as to hold the melt 6 at a temperature suitable for the growth of a Si single crystal.

A seed crystal 7 is located in contact with the melt 6, so as to grow a Si single crystal 8 having the crystalline orientaiton imitating the orientation of the seed crystal 7. The seed crystal 7 is hung down through a wire 9 from a rotary winder 10 or a rigid pulling-up rod, and gradually pulled upwards in response to the degree of crystal growth. The crucible 2 is descended by the proper rotating motion of the support 3, too. The descending and rotating speed of the support 3 as well as the ascending and rotating speed of the seed crystal 7 are controlled in response to the growing speed of the Si single crystal 8 being pulled up from the melt 6.

The monocrystallization of the crystal 8 pulled up from the melt 6 is significantly affected by the dynamic motion of the melt 6. Especially, eddy flows generated in the melt 6 around the single crystal 8 put biggest influences on the monocrystallization.

On the other hand, the density of the Si melt nonlinearly changes in the temperature range of 1430° C. or lower, although the density deviation above 1430° C. is linear in relation with the temperature of the melt. Consequently, the vortex of the melt changes from the stable eddy state of the melt shown in FIG. 2 to the unstable eddy state as shown in FIG. 3. The state (shown in FIG. 3) where eddy flows are irregular a little bit has the effect to make the temperature distribution of the melt uniform at the surface.

However, when a dopant which suppresses the nonlinearity of the density below 1430° C. and makes the density deviation linear in relation with the temperature is added to the melt, big change is not noted in the circulating state of the melt, but the state of eddy flows is stabilized as shown in FIG. 2. The stabilized state permits the presence of a cold zone which has harmful influences on the quality of a growing crystal. For instance, the deviation of the vortex becomes so big to promote the irregular inclusion of a dopant or the introduction of dislocation in the crystal.

The stabilized state fluctuates the temperature distribution of the melt at the surface, too. The single crystal pulled up from the melt alternatively comes in contact with the hot and cool zones of the melt, so as to induce crystallographic faults caused by the temperature deviation into the grown crystal.

Consequently, monocrystallization is impeded, and an obtained single crystal has poor crystallographic properties.

SUMMARY OF THE INVENTION

The present invention is accomplished to overcome the defects above-mentioned.

One object of the present invention is to distinguish the quality of a single crystal pulled up from a melt.

Another object of the present invention is to grow a single crystal of stabilized quality from a melt held under the condition that eddy flows are generated at the surface so as to make the temperature distribution of the melt uniform in the vicinity of the single crystal.

When a Si single crystal is pulled up from a melt received in a crucible according to the present invention, the vortex state in the melt is detected by the temperature distribution at the surface. The detected results representing the stable or unstable vortex state of the melt are used for distinguishing the quality of the obtained single crystal, since the unstable vortex state means that the single crystal is grown with uniform temperature distribution at the interface of crystal growth, while the stable vortex state means that monocrystallization is impeded by the fluctuated thermal affection.

The detected results are useful for controlling the temperature condition of the melt at the interface of crystal growth, too. When the stable vortex state is detected, the gas which has the effect to generate extraordinary deviation in the density of the melt is added to an atmosphereic gas, so as to hold the unstable vortex state of the melt.

The gas which can generate the extraordinary deviation in the density may be $N_2$, Kr or Xe. The effect of these gases is typically noted in the case where a Si single crystal is grown up from the melt to which Ga, Sb, Al, As or In is added.

DETAILED DESCRIPTION OF THE PREFERRED EMBODIMENTS

Figure 1:
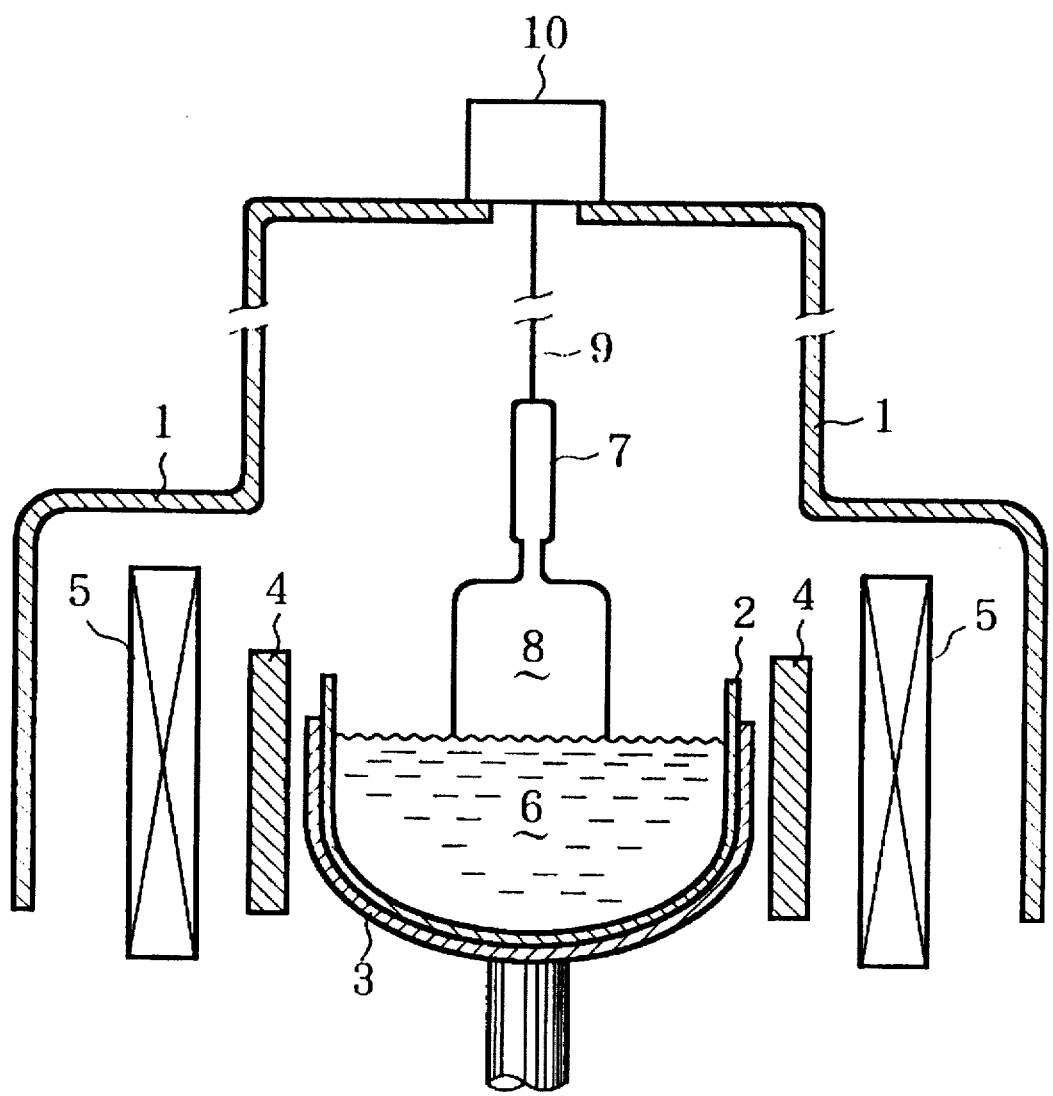
FIG. 1 is a schematic view for explaining the Czochralski method of pulling up a Si single crystal from a melt.
Figure 2:
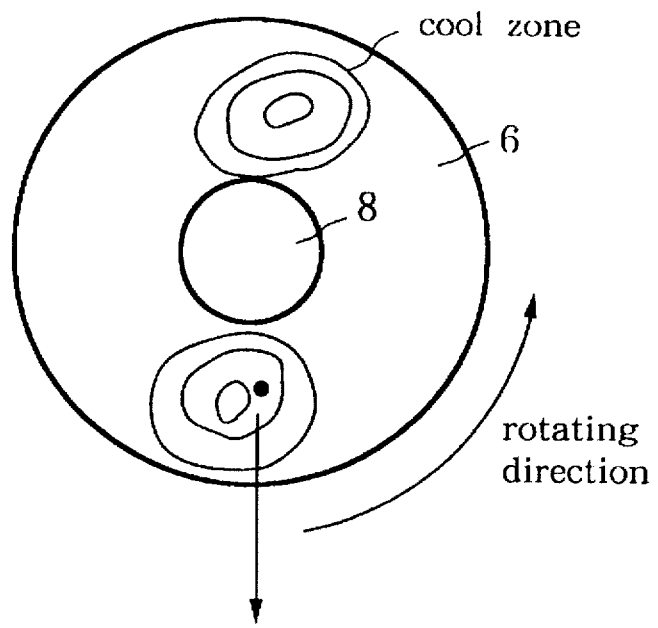
FIG. 2 is a view illustrating a constant temperature map on the surface of the melt in which eddy flow patterns are generated regularly.

The state of eddy flows which appears on the surface of the melt 6 is derived from the recovery of heat tranfer which is suppressed by the rotation of a crucible. Under the condition that eddy flows are in a stabilized state as shown in FIG. 2, the bottom of a single crystal 8 alternatively comes in contact with the hot and cool parts of the melt 6. Consequently, the crystalline structure of the single crystal 8 is likely to be destroyed.

Figure 3:
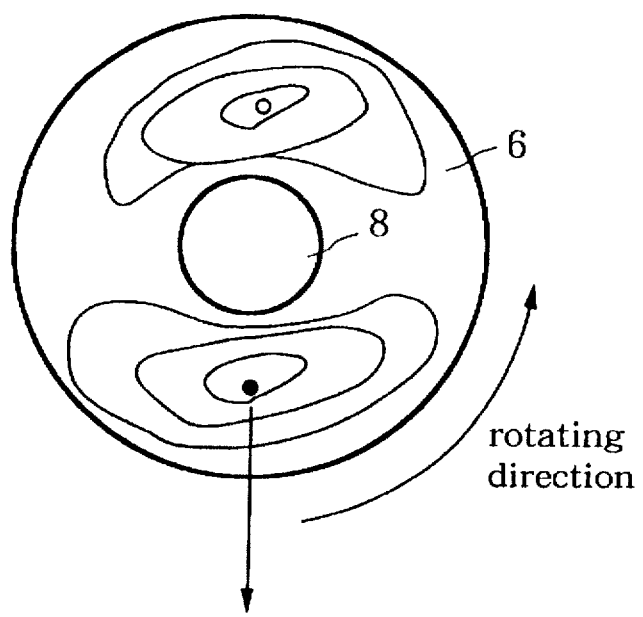
FIG. 3 is a view illustrating a constant temperature map on the surface of the melt in which the eddy flow patterns are irregular.

On the other hand, when the surface of the melt 6 is in the state where eddy flows are irregular a little bit as shown in FIG. 3, the temperature distribution of the melt 6 is made uniform at the surface. The single crystal 8 pulled up from the melt 6 in this state has good monocrystallization. Therefore, when this state is detected, the obtained single crystal can be distinguished as a high-quality product.

Figure 6:
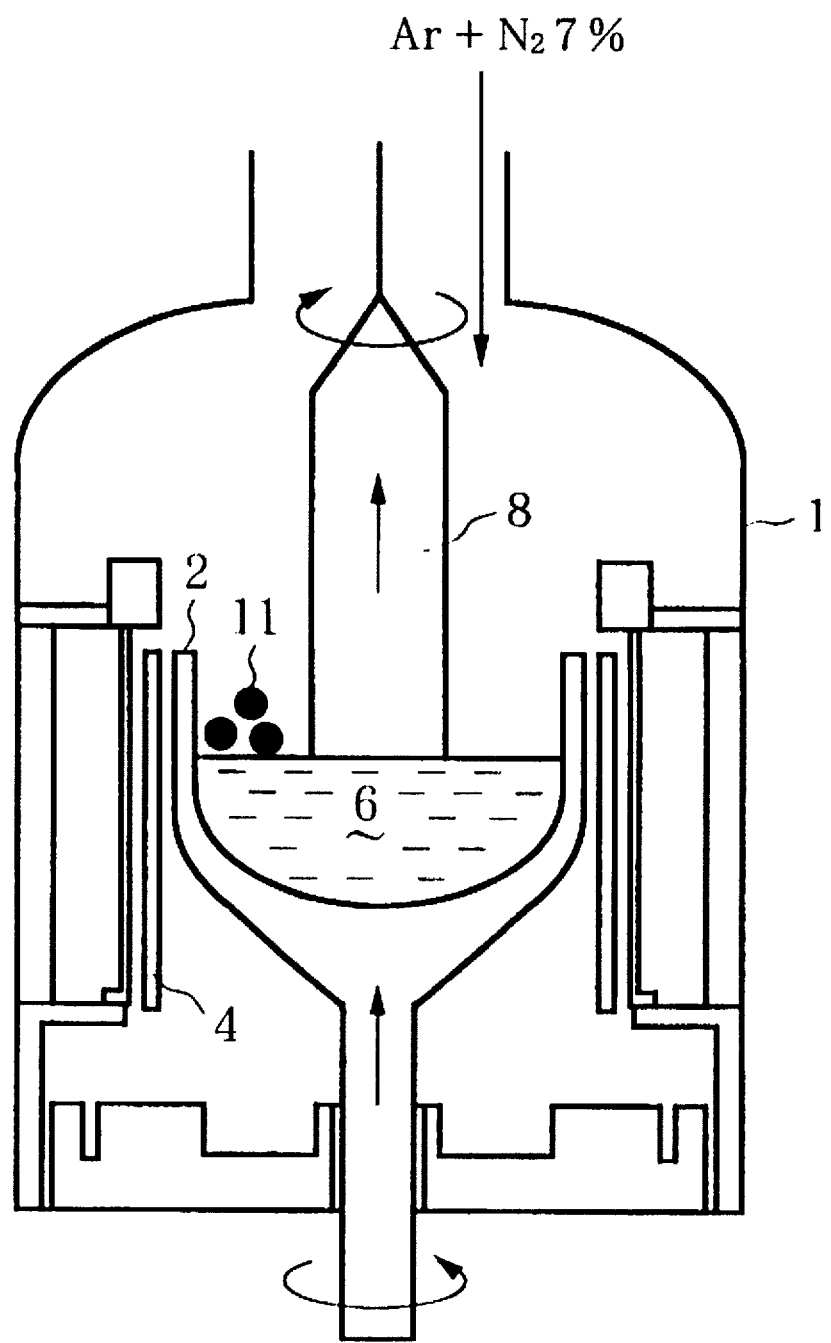
FIG. 6 is a schematic view for explaining the introduction of $N_2$-added gas into a chamber to control the flowing condition of the melt at the surface according to the present invention.

Especially in the melt to which Ga or Sb 11 is added as shown in FIG. 6, the density of the melt changes linearly in relation with its temperature. That is, there is not abrupt change in the vortex around 1430° C., and the state of eddy flows is likely to be stabilized. In this case, by using Ar gas mixed with $N_2$, Kr or Xe as an atmosphere for crystal growth, the density of the melt is abruptly changed around 1430° C. As a result, the state of eddy flows is destroyed a little bit and becomes irregular by the violently oscillating vortex which is generated at a temperature below 1430° C., so as to generate the extraordinary deviation in the density effective for the homogeneous growth of a single crystal.

EXAMPLE

Figure 4:
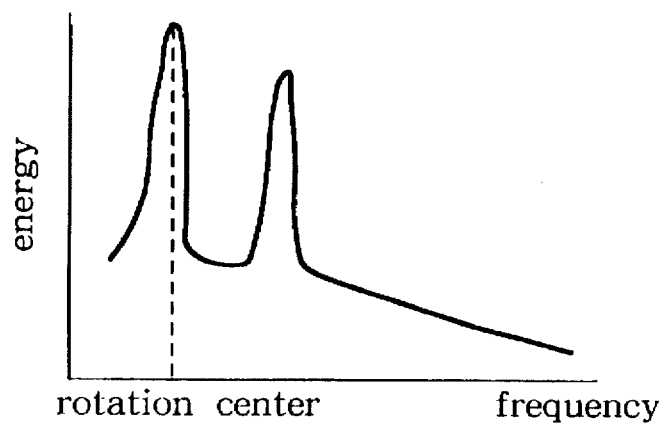
FIG. 4 is an energy spectrogram illustrating the state of eddy flows generated in a melt free from extraordinary density.

A Sb-doped Si single crystal of 3 inches in diameter was pulled up from the Si melt to which Sb in an amount of 0.1 atomic % was added as a dopant at a speed of 1 mm/hr.. The stationary state of eddy flows as shown in FIG. 2 was detected by the observation of the melt at the surface. FIG. 4 shows the energy spectrum obtained by measuring the temperature of the melt at the surface, and Fourier transforming the temperature deviation.

As shown in FIG. 4, sharp peaks were detected at the rotation center of the crucible and at the position apart from the rotation center in a distance corresponding to the multiple of frequency. The latter sharp peak means the stationary existence of cool zones as shown in FIG. 2.

Figure 5:
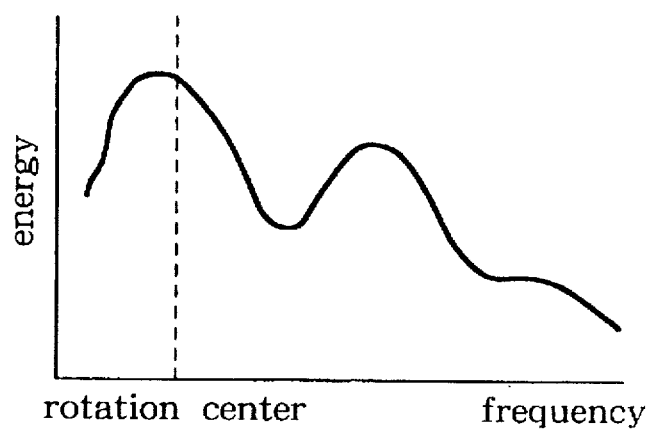
FIG. 5 is an energy spectrogram illustrating the state of eddy flows generated in a melt having extraordinary density.

On the other hand, a single crystal 8 was pulled up from the same melt 6 but held in an Ar atmosphere mixed with $N_2$ in an amount of 7 vol. %, while feeding the Ar-$N_2$ gas to the chamber 1 as shown in FIG. 6. In this case, the state that eddy flows were destroyed a little bit as shown in FIG. 3 was detected on the surface of the melt 6. The energy spectrum calculated from the temperature measured at the same point as that in FIG. 3 did not have any sharp peak as shown in FIG. 5, but was broadened at the same point as above-mentioned. This energy spectrum means that the state of eddy flows was destroyed and expanded along the rotational direction. Consequently, it is understood that the temperature deviation in the melt was made smaller at the surface.

When FIGS. 3 and 5 are compared with FIGS. 2 and 4, it is noted that the state of eddy flows is destroyed by the addition of $N_2$ to the atmosphere, so that the temperature distribution near the interface of crystal growth is made uniform. The extraoridinary density distribution generated in this way effectively reforms the surface of the melt into soft turbulent state. Consequently, the ratio of monocrystallization is improved.

For instance, when pulling-up operation was repeated 10 cycles using a Sb-doped Si melt held in an ordinary atmoshpere, only 5 single crystals good of monocrystallization were obtained. On the other hand, monocrystallization was performed up to 9 times by using the Ar atmosphere mixed with $N_2$.

According to the present invention as above-mentioned, the composition of atmospheric gas to be fed into a chamber is controlled in response to the state of eddy flows generated on the surface of a melt, so as to make temperature distribution uniform near the interface of crystal gowth. Consequenlty, a single crystal is grown up under the condition to keep the concentration of impurities at a constant value. The single crystal obtained in this way has an impurity distribution and oxygen distribution made uniform along the direction of crystal growth, and can be used as semiconductor material having stabilized properties.

What is claimed is:

1. A method of growing and distinguishing a quality of a Si single crystal from a melt having a surface, comprising the steps of:

detecting a state of eddy flows generated on the surface of the melt received in a crucible from the temperature distribution of the melt at the surface when the single crystal is pulled up from the melt, and distinguishing the single crystal pulled up from the melt in an unstable vortex state as a high-quality product.

2. A method of growing a Si single crystal containing at least one impurity which suppresses a temperature deviation of a melt having a surface, comprising the steps of:

detecting a state of eddy flows generated on the surface of the melt received in a crucible from the temperature distribution of the melt at the surface when the single crystal is pulled up from the melt, and introducing a gas which causes deviation in the density of the melt into an atmospheric gas in contact with the melt, so as to hold the melt under a condition in which the eddy flows are unstable.

3. The method according to claim 2, wherein the at least one impurity is selected from the group consisting of Ga, Sb, Al, As and In, which determine the electrical resistivity of the crystal.

4. A method of growing a Si single crystal under a condition to suppress a temperature deviation of a melt having a surface, comprising the steps of:

detecting a state of eddy flows generated on the surface of the melt received in a crucible from the temperature distribution of the melt at the surface when the single crystal is pulled up from the melt; and introducing a gas which causes deviation in the density of the melt into an atmospheric gas in contact with the melt, so as to hold the melt under a condition in which the eddy flows are unstable, wherein the gas causing the deviation in the density of the melt is at least one of $N_2$, Kr and Xe.

* * * * *

UNITED STATES PATENT AND TRADEMARK OFFICE
CERTIFICATE OF CORRECTION

PATENT NO. : 5,704,974
DATED : January 6, 1998
INVENTOR(S) : Koji Izunome et al.

It is certified that error appears in the above-identified patent and that said Letters Patent is hereby corrected as shown below:

Title Page, [57] ABSTRACT, Lines 4-5, "the gas" should read --a gas--.

Title Page, [57] ABSTRACT, Line 9, "Ca" should read --Ga--.

Column 1 Line 9 after "The" insert --Czochralski--.

Column 1 Line 11 after "The" insert --Czochralski--.

Signed and Sealed this

Fourteenth Day of April, 1998

Attest:

BRUCE LEHMAN

*Attesting Officer*   *Commissioner of Patents and Trademarks*